(12) United States Patent
Zi et al.

(10) Patent No.: US 12,106,961 B2
(45) Date of Patent: Oct. 1, 2024

(54) HUMIDITY CONTROL OR AQUEOUS TREATMENT FOR EUV METALLIC RESIST

(71) Applicant: Taiwan Semiconductor Manufacturing Co., Ltd., Hsinchu (TW)

(72) Inventors: An-Ren Zi, Hsinchu (TW); Yahru Cheng, Hsinchu (TW); Ching-Yu Chang, Hsinchu (TW); Chin-Hsiang Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 235 days.

(21) Appl. No.: 17/581,671

(22) Filed: Jan. 21, 2022

(65) Prior Publication Data

US 2023/0012705 A1   Jan. 19, 2023

Related U.S. Application Data

(60) Provisional application No. 63/222,904, filed on Jul. 16, 2021.

(51) Int. Cl.
*H01L 21/027* (2006.01)
*G03F 7/32* (2006.01)
*H01L 21/308* (2006.01)

(52) U.S. Cl.
CPC ...... *H01L 21/0274* (2013.01); *H01L 21/3081* (2013.01)

(58) Field of Classification Search
None
See application file for complete search history.

(56) References Cited

U.S. PATENT DOCUMENTS

| | | | | |
|---|---|---|---|---|
| 2003/0027083 | A1* | 2/2003 | Fuller | G03F 7/168 430/290 |
| 2005/0167894 | A1* | 8/2005 | Shih | B82Y 40/00 264/319 |
| 2015/0079792 | A1* | 3/2015 | Shigaki | G03F 7/0751 524/838 |
| 2019/0086818 | A1* | 3/2019 | Zi | G03F 7/38 |
| 2019/0101829 | A1* | 4/2019 | Seshadri | G03F 7/11 |
| 2020/0041906 | A1* | 2/2020 | Shibayama | H01L 21/02057 |
| 2020/0073238 | A1* | 3/2020 | Zi | G03F 7/039 |

* cited by examiner

*Primary Examiner* — Shamim Ahmed
(74) *Attorney, Agent, or Firm* — Seed IP Law Group LLP

(57) ABSTRACT

A method for forming a semiconductor device is provided. The method includes applying a photoresist composition over a substrate, thereby forming a photoresist layer over the substrate; performing a first baking process to the photoresist layer; exposing the photoresist layer to an extreme ultraviolet (EUV) radiation, thereby forming a pattern therein; performing a second baking process to the photoresist layer; and developing the photoresist layer having the pattern therein using a developer, thereby forming a patterned photoresist layer. The first baking process and the second baking process are conducted under an ambient atmosphere having a humidity level ranging from 55% to 100%.

20 Claims, 10 Drawing Sheets

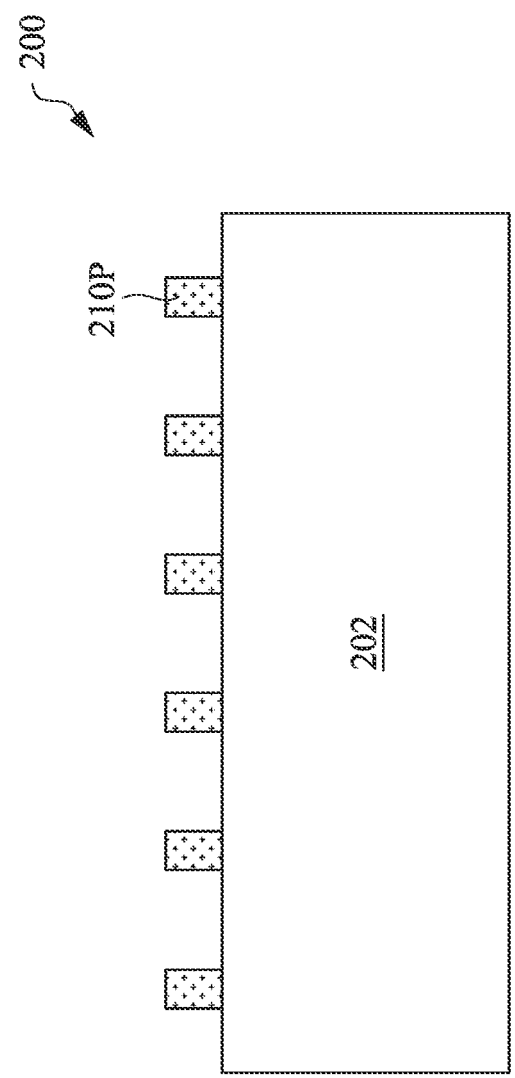

HUMIDITY CONTROL OR AQUEOUS TREATMENT FOR EUV METALLIC RESIST

PRIORITY CLAIM AND CROSS-REFERENCE

This application claims the benefit of U.S. Provisional Patent Application No. 63/222,904, filed Jul. 16, 2021, which is incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2F are cross-sectional views of a semiconductor device fabricated using the method of FIG. 1, in accordance with some embodiments.

DETAILED DESCRIPTION

Figure 1:
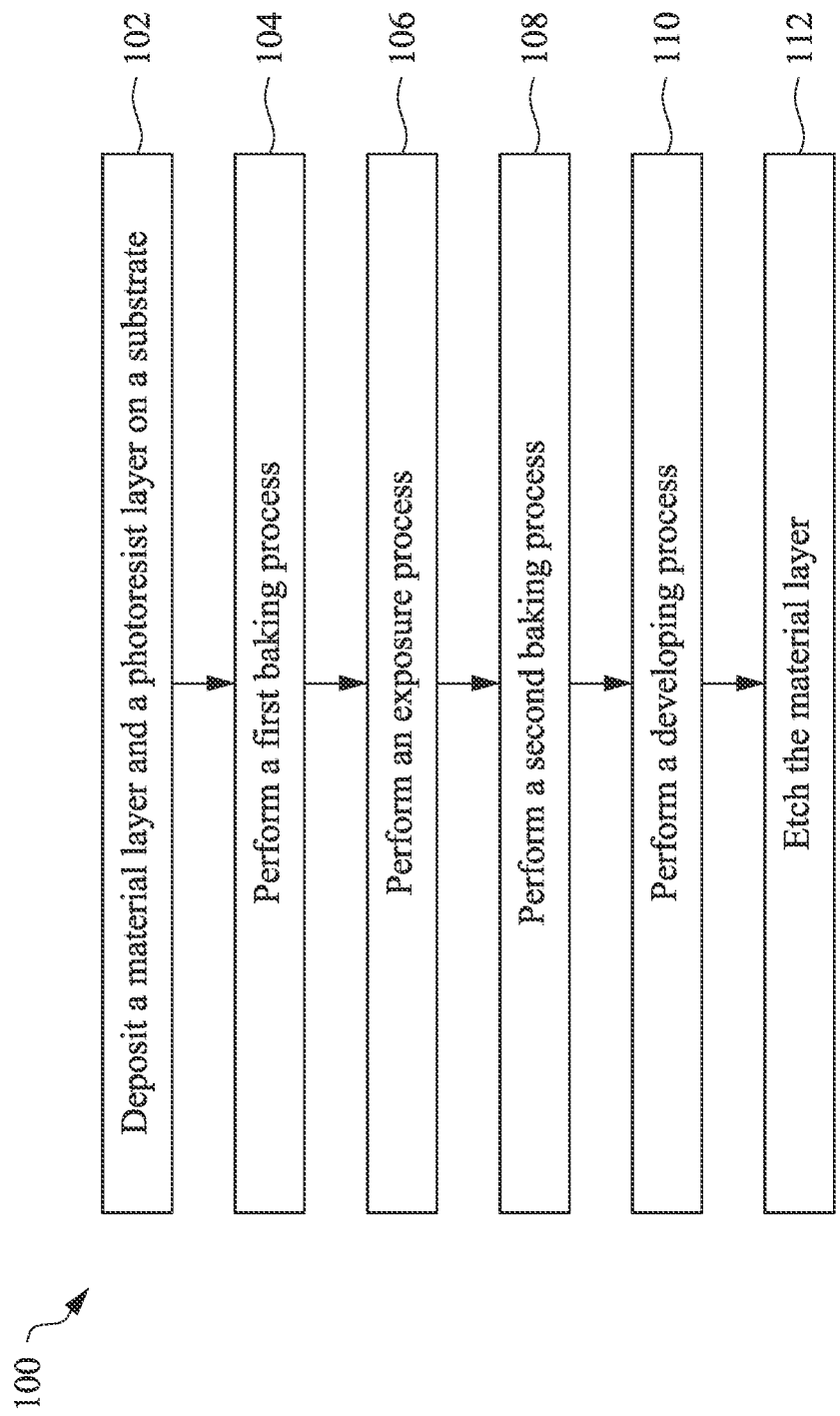
FIG. 1 is a flow chart of a method for fabricating a semiconductor device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. System may be otherwise oriented (rotated 90 degrees or at other orientations) and the spatially relative descriptors used herein may likewise be interpreted accordingly.

IC fabrication uses one or more photolithography processes to transfer geometric patterns to a film or substrate. Geometric shapes and patterns on a semiconductor make up the complex structures that allow the dopants, electrical properties and wires to complete a circuit and fulfill a technological purpose. In a photolithography process, a photoresist is applied as a thin film to a substrate, and subsequently exposed to one or more types of radiation or light through a photomask. The photomask contains clear and opaque features that define a pattern which is to be created in the photoresist layer. Areas in the photoresist exposed to light transmitted through the photomask are made either soluble or insoluble in a specific type of solution known as a developer. In the case when the exposed regions are soluble, a positive image of the photomask is produced in the photoresist and this type of photoresist is called a positive photoresist. On the other hand, if the unexposed areas are dissolved by the developer, a negative image results in the photoresist and this type of photoresist is called a negative photoresist. The developer removes the more soluble areas, leaving the patterned photoresist in place. The resist pattern is then used as an etch mask in subsequent etching processes, transferring the pattern to an underlying material layer, thereby replicating the mask pattern in the underlying material layer. Alternatively, the resist pattern is then used as an ion implantation mask in subsequent ion implantation processes applied to the underlying material layer, such as an epitaxial semiconductor layer.

As the semiconductor device sizes continue to shrink, for example, below 20 nanometer nodes, traditional lithography technologies have optical restrictions, which leads to resolution issues and may not achieve the desired lithography performance. In comparison, extreme ultraviolet (EUV) lithography using EUV radiation around 13.5 nm can achieve much smaller device sizes. However, as the decrease in wavelength causes decrease in photo flux, conventional polymer-based photoresists, which suffer from low absorption efficiency to EUV radiation, are no longer suitable for EUV lithography as they require longer exposure time, resulting in reduced throughput and leading to various patterning issues, such as line width roughness (LWR) and critical dimension (CD) non-uniformity.

Photoresists containing metals with high EUV absorbance coefficients have been developed to improve the resist sensitivity to the EUV radiation, thereby lowering exposure doses required for defining the pattern in the photoresist layer. For example, organometallic compounds containing metal cores and organic ligands are used as precursors for EUV photoresist. The organometallic compounds may undergo hydrolysis and condensation reactions in the presence of water. Through a series of hydrolysis and condensation reaction, the organometallic compounds form organometallic oxide hydroxide clusters which can be converted into insoluble metal oxide clusters upon radiation.

The humidity level in the photoresist layer or near the photoresist layer may affect the extent of hydrolysis of the organometallic compounds. As such, the present disclosure intentionally introduces water or humidity to various steps of the EUV lithography. Higher water content in the ambient environment or in the photoresist layer facilitates the hydrolysis and condensation of organometallic compounds, thereby improving both EUV lithography performance and throughput. The source of water may be from the photoresist itself, from ambient humidity, and/or from a processing operation such as rinsing.

FIG. 1 is a flowchart illustrating a method 100 of fabricating a semiconductor device 200, in accordance with some embodiments of the present disclosure. FIGS. 2A through 2F are cross-sectional views of a semiconductor device 200 at various fabrication stages in accordance with some embodiments of the present disclosure. The method 100 is described below in conjunction with FIG. 1 and FIGS. 2A through 2F wherein the semiconductor device 200 is fabricated by using embodiments of the method 100. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

The semiconductor device 200 may be an intermediate structure during the fabrication of an IC, or a portion thereof. The IC may include logic circuits, memory structures, passive components (such as resistors, capacitors, and inductors), and active components such as diodes, field-effect transistors (FETs), metal-oxide semiconductor field effect transistors (MOSFETs), complementary metal-oxide semiconductor (CMOS) transistors, bipolar transistors, high voltage transistors, high frequency transistors, fin-like FETs (FinFETs), other three-dimensional (3D) FETs, and combinations thereof. The semiconductor device 200 may include a plurality of semiconductor devices (e.g., transistors), which may be interconnected.

Figure 2A:
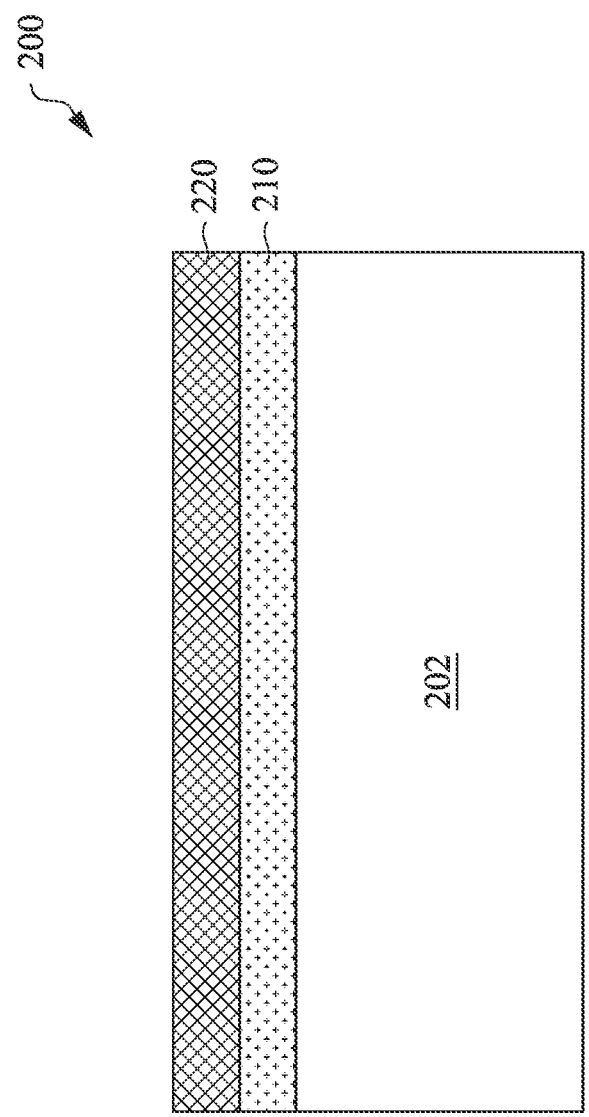

Referring to FIGS. 1 and 2A, the method 100 includes operation 102, in which a material layer 210 and a photoresist layer 220 are sequentially deposited on a substrate 202, in accordance with some embodiments. FIG. 2A is a cross-sectional view of a semiconductor device 200 after sequentially depositing the material layer 210 and the photoresist layer 220 on the substrate 202, in accordance with some embodiments.

In some embodiments, the substrate 202 may be a bulk semiconductor substrate including one or more semiconductor materials. In some embodiments, the substrate 202 may include silicon, silicon germanium, carbon doped silicon (Si:C), silicon germanium carbide, or other suitable semiconductor materials. In some embodiments, the substrate 202 is composed entirely of silicon.

In some embodiments, the substrate 202 may include one or more epitaxial layers formed on a top surface of a bulk semiconductor substrate. In some embodiments, the one or more epitaxial layers introduce strains in the substrate 202 for performance enhancement. For example, the epitaxial layer includes a semiconductor material different from that of the bulk semiconductor substrate, such as a layer of silicon germanium overlying bulk silicon or a layer of silicon overlying bulk silicon geranium. In some embodiments, the epitaxial layer(s) incorporated in the substrate 202 are formed by selective epitaxial growth, such as, for example, metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), or combinations thereof.

In some embodiments, the substrate 202 may be a semiconductor-on-insulator (SOI) substrate. In some embodiments, the SOI substrate includes a semiconductor layer, such as a silicon layer formed on an insulator layer. In some embodiments, the insulator layer is a buried oxide (BOX) layer including silicon oxide or silicon germanium oxide. The insulator layer is provided on a handle substrate such as, for example, a silicon substrate. In some embodiments, the SOI substrate is formed using separation by implanted oxygen (SIMOX) or other suitable technique, such as wafer bonding and grinding.

In some embodiments, the substrate 202 may also include a dielectric substrate such as silicon oxide, silicon nitride, silicon oxynitride, a low-k dielectric, silicon carbide, and/or other suitable layers.

In some embodiments, the substrate 202 may also include various p-type doped regions and/or n-type doped regions, implemented by a process such as ion implantation and/or diffusion. Those doped regions include n-well, p-well, lightly doped region (LDD) and various channel doping profiles configured to form various IC devices, such as a COMOS transistor, imaging sensor, and/or light emitting diode (LED). The substrate 202 may further include other functional features such as a resistor and/or a capacitor formed in and/or on the substrate 302.

In some embodiments, the substrate 202 may also include various isolation features. The isolation features separate various device regions in the substrate 202. The isolation features include different structures formed by using different processing technologies. For example, the isolation features may include shallow trench isolation (STI) features. The formation of an STI may include etching a trench in the substrate 202 and filling in the trench with insulator materials such as silicon oxide, silicon nitride, and/or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

In some embodiments, the substrate 202 may also include gate stacks formed by dielectric layers and electrode layers. The dielectric layers may include an interfacial layer and a high-k dielectric layer deposited by suitable techniques, such as chemical vapor deposition (CVD), atomic layer deposition (ALD), physical vapor deposition (PVD), thermal oxidation, combinations thereof, and/or other suitable techniques. The interfacial layer may include silicon dioxide and the high-k dielectric layer may include LaO, AlO, ZrO, TiO, $Ta_2O_5$, $Y_2O_3$, $SrTiO_3$, $BaTiO_3$, BaZrO, HfZrO, HfLaO, HfSiO, LaSiO, AlSiO, HfTaO, HfTiO, $(Ba,Sr)TiO_3(BST)$, $Al_2O_3$, $Si_3N_4$, SiON, and/or other suitable materials. The electrode layer may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The electrode layer may include Ti, Ag, Al, TiAlN, TaC, TaCN, TaSiN, Mn, Zr, TiN, TaN, Ru, Mo, Al, WN, Cu, W, any suitable materials, and/or a combination thereof.

In some embodiments, the substrate 202 may also include a plurality of inter-level dielectric (ILD) layers and conductive features integrated to form an interconnect structure configured to couple the various p-type and n-type doped regions and the other functional features (such as gate electrodes), resulting in a functional integrated circuit. In one example, the substrate 202 may include a portion of the interconnect structure and the interconnect structure may include a multi-layer interconnect (MLI) structure and an ILD layer integrated with a MLI structure, providing an electrical routing to couple various devices in the substrate 202 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

The material layer 210 is disposed on the substrate 202. The material layer 210 is a layer to be processed by the method 100, such as to be patterned or to be implanted. In some embodiments, the material layer 210 is a hard mask layer to be patterned. In some embodiments, the material layer 210 includes a dielectric material such as silicon oxide, silicon nitride, or silicon oxynitride. In some other embodiments, the material layer 210 includes a metal oxide such as titanium oxide or a metal nitride such as titanium nitride. In some embodiments, the material layer 210 also serves as an anti-reflection coating (ARC) layer whose composition is chosen to minimize reflectivity of radiation implemented during exposure of the photoresist layer 220. For example, in some embodiments, the material layer 210 includes silicon oxide, silicon oxygen carbide, or plasma enhanced chemical vapor deposited silicon oxide. The material layer 210 may be formed by any suitable process including chemical vapor deposition (CVD), physical vapor deposition (PVD), plasma enhanced chemical vapor deposition (PECVD), atomic layer deposition (ALD), or spin coating, and may be formed to any suitable thickness.

The photoresist layer 220 is disposed on the material layer 210. The photoresist layer 220 is sensitive to a radiation such as a DUV radiation (e.g., 248 nm radiation from a KrF laser or 193 nm radiation from an ArF laser), an EUV radiation (e.g., 13.5 nm radiation), an electron beam (e-beam), or an ion beam. In the present embodiment, the photoresist layer 220 is sensitive to the EUV radiation and is used in an EUV lithography process. However, the EUV sensitivity of the photoresist layer 220 is needed to be enhanced through operations in the method 100.

In some embodiments, the photoresist layer 220 includes a metallic photoresist that is sensitive to the EUV radiation. In some embodiments, the photoresist layer 220 may include an organometallic compound that includes a metallic core coordinated with a plurality of organic ligands. When the photoresist layer 220 is exposed to radiation, radiation exposure causes cleavage of the metal-carbon bond, leading to condensation and formation of insoluble metal oxide film. In some embodiments, the metallic core is selected from a metal having a high EUV absorption coefficient such as tin (Sn), hafnium (Hf), zirconium (Zr), silver (Ag), cadmium (Cd), indium (In), antimony (Sb), tellurium (Te), caesium (Cs), gold (Au), barium (Ba), thallium (Tl), bismuth (Bi), or cerium (Ce). In some embodiments, the organic ligands include aliphatic or aromatic groups. The aliphatic or aromatic groups may be straight or branched with cyclic or noncyclic saturated pendant groups containing 1-9 carbons, including alkyl groups, alkenyl groups, and phenyl groups. The branched groups may be further substituted with oxygen or halogen in come embodiments. The ligands can be, for example, alkyls (e.g., methyl, ethyl, propyl, butyl, t-butyl, aryl (phenyl, benzyl)), alkenyls (e.g., vinyl, allyl), and carboxylates (acetate, propanoate, butanoate benzoate).

In some embodiments, the photoresist layer 220 is formed by applying a photoresist composition over the material layer 210 using, for example, a spin coating process. In some embodiments, the photoresist composition includes at least one kind of organometallic compounds and at least one kind of solvents. The amount of the organometallic compound in the photoresist composition may be from about 0.5% to 10% by weight. In some embodiments, the photoresist composition may include about 1% organometallic compound by weight.

Figure 3:
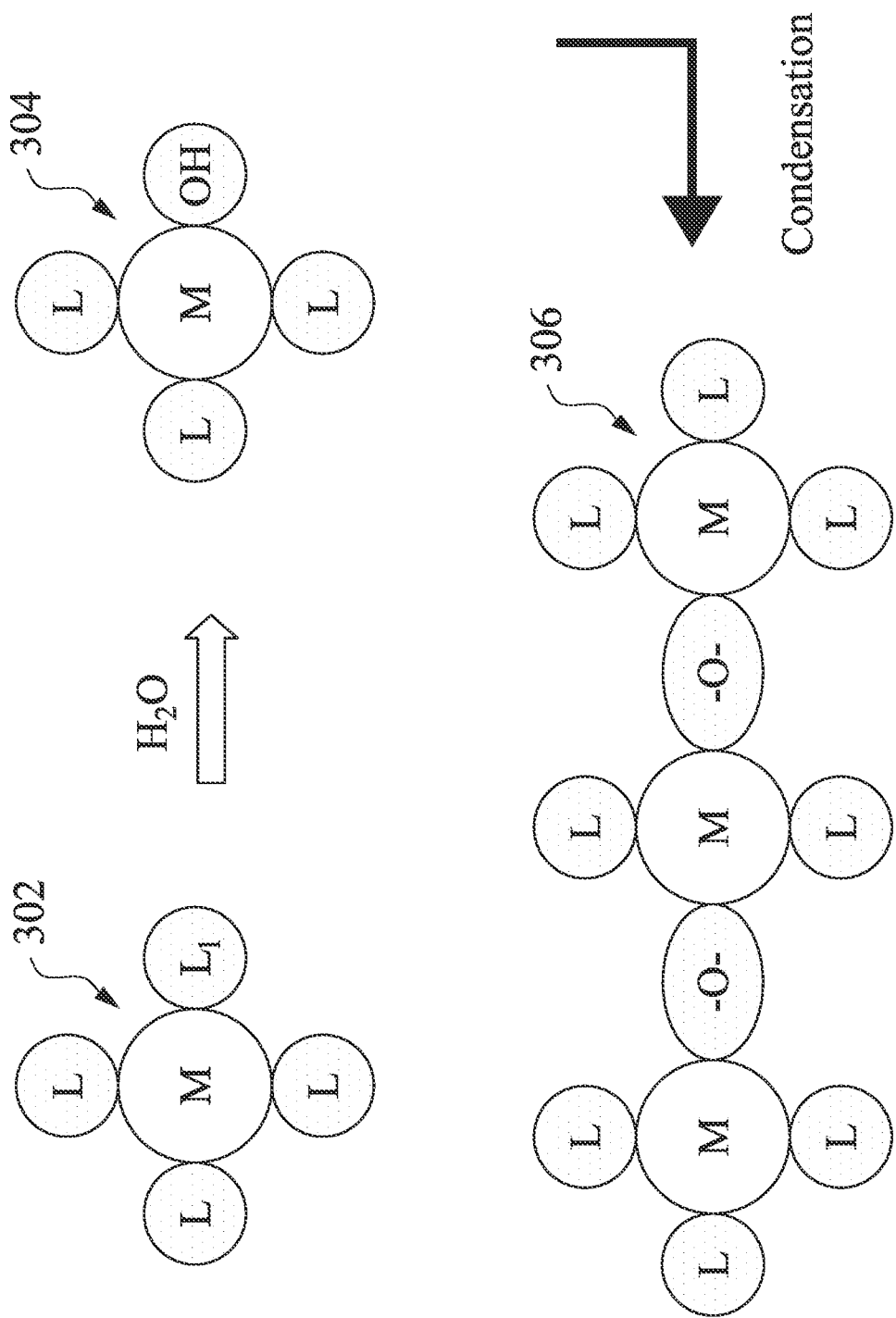
FIG. 3 illustrates an exemplary organometallic compound and reactions in the presence of water.

Referring to FIG. 3, an organometallic compound in the photoresist composition may be represented by a compound 302. The compound 302 includes a metallic core, represented by "M," coordinated to a plurality of organic ligands "L" and a hydrolysable ligand $L_1$. It is noted that while the metallic core is shown to coordinate with four ligands, coordination with less or more ligands is envisioned. As shown in FIG. 3, in the presence of water, the compound 302 is hydrolyzed, that is, the hydroxyl replaces the hydrolysable ligand and bond to the core M, resulting in a compound 304. More than one compound 304 may undergo a condensation reaction to form an organometallic polymer 306. It is noted that while the organometallic polymer 306 includes three monomer compounds 302, organometallic polymers with less or more monomer compounds 302 are envisioned.

The solvent is capable of dissolving the organometallic compounds. Examples of solvents include, but are not limited to, ethers, glycol ether, esters, ketones, and the like. Suitable ethers include anisole and tetrahydrofuran. Suitable glycol ethers include 2-methoxyethyl ether (diglyme), ethylene glycol monomethyl ether, and propylene glycol monomethyl ether. Suitable esters include methyl acetate, ethyl acetate, ethoxy ethyl propionate, and propylene glycol monomethylether acetate (PGMEA). Suitable ketones include methylisobutylketone, 2-heptanone, cycloheptanone, and cyclohexanone. These solvents may be used either alone or in combination with one another.

For conventional photoresist layers, no water is specifically introduced during the formation of the photoresist layer. In comparison, according to the various aspects of the present disclosure, water is intentionally added during formation of the photoresist layer 220. Because water is a reactant that plays a role in hydrolysis of organometallic compounds, additional water added during the EUV lithography processes facilitates hydrolysis of organometallic compounds and prevents the aggregation of the organometallic compounds. Consequently, the resist sensitivity can be improved. The source of the additional water may be from the photoresist itself, from ambient humidity, and/or from a processing operation such as rinsing.

In some embodiments, water may be introduced into the photoresist layer 220 by directly adding water into the photoresist composition so that water that remains within the photoresist layer 220 after spin coating contributes to the increased humidity level in the photoresist layer 220. The amount of water in the photoresist composition is optimized by the solubility of the organometallic compound such that after adding water, the organometallic compound remains dissolved by the solvent. In some embodiments, the photoresist composition includes from about 0.0001% to about 5% by weight of water relative to the solvent in the photoresist composition.

In some embodiments, to help to further attract water from the ambient environment, the photoresist composition also includes one or more additives such as one or more acids, one or more bases, and/or one or more alcohol-type additives that have certain affinity to water. In some embodiments, the amount of the additives in the photoresist composition may be from about 0.00001% to 99% by weight relative to water in the photoresist composition.

Suitable acids that can be employed in the present disclosure may have an acid dissociation constant, pKa, between $-15<pKa<7$. In some embodiments, the additive is an organic acid including, but not limited to, acetic acid, ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, oxalic acid, maleic acid, carbonic acid, oxoethanoic acid, 2-hydroxyethanoic acid, propanedioic acid, butanedioic acid, 3-oxobutanoic acid, hydroxylamine-O-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, benzenesulfonic acid, 5-sulfosalicylic acid, and combinations thereof. In some embodiments, the additive is an inorganic acid including, but are not limited to, nitric acid ($HNO_3$), sulfuric acid ($H_2SO_4$), hydrofluoric acid (HF), hydrochloric acid (HCl), hydrobromic acid (HBr), hydroiodic acid (HI), phosphoric acid ($H_3PO_4$), perchloric acid ($HClO_4$), and combination thereof.

Suitable bases that can be employed in the present disclosure may have a pKa of $40>pKa>7$. In some embodiments, the additive is an organic base including, but not limited to, monoethanolamine, monoisopropanolamine, 2-amino-2-methyl-1-propanol, 1H-benzotriazole, 1,2,4-triazole, 1,8-diazabicycloundec-7-ene, 1,5-diazabicyclo[4.3.0]non-5-ene, tetrabutylammonium hydroxide, tetramethylammonium hydroxide (TMAH), tetraethylammonium hydroxide (TEAH), tetrapropylammonium hydroxide, and combinations thereof. In some embodiments, the additive is an inorganic base including, but not limited to, ammonia ($NH_3$), ammonium hydroxide ($NH_3OH$), ammonium sulfamate, ammonium carbamate, sodium hydroxide (NaOH), potassium hydroxide (KOH), and combinations thereof.

Figure 4:
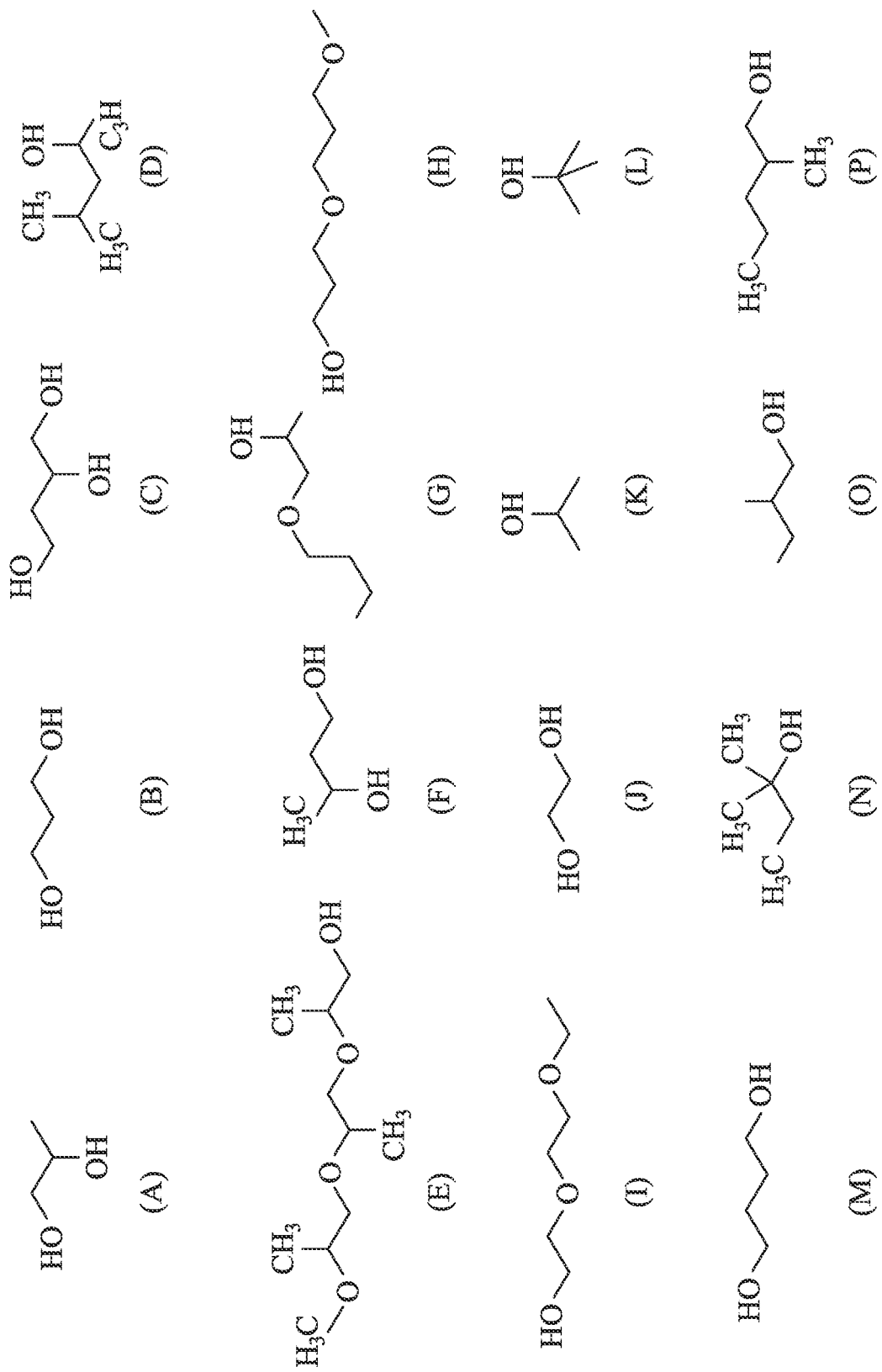
FIG. 4 illustrates molecular formulae of exemplary alcohol additives, in accordance with some embodiments.

Suitable alcohol-type additives include, but are not limited to, 1,3-propanediol, propylene glycol, 1,3-butanediol, propylene glycol butyl ether, dipropylene glycol monomethyl ether, diethylene glycol monoethyl ether, di(propylene glycol) butyl ether, tri(propylene glycol) butyl ether, ethylene glycol, isopropyl alcohol, benzyl alcohol, 1,4-butanediol, 1,2,4-butanetriol, butanol, 2-butanol, tert-butyl alcohol, tert-amyl alcohol, 2-methyl-1-butanol, 2-methyl-1-pentanol, methyl isobutyl carbinol, and combinations thereof. Examples of some alcohols, including alcohols (A)-(P), are illustrated in FIG. 4.

In some embodiments, water may be introduced into the photoresist layer 220 by pre-treating the underlying material layer 210 prior to depositing the photoresist layer 220. In some embodiments, water is introduced into the underlying material layer 210 by adding water into a material composition from which the material layer 210 is formed.

In some embodiments, before depositing the photoresist layer 220, the surface of the material layer 210 may be treated with water, so that water can diffuse into the photoresist layer 220 subsequently formed thereon to increase the water content in the photoresist layer 220. In some embodiments, after depositing the photoresist layer 220, the surface of the photoresist layer 220 may be treated with water to increase the water content in the photoresist layer 220.

In some embodiments, water treatment of the surface of the material layer 210 and/or the surface of the photoresist layer 220 may be performed by a rinse process. The rinse process includes rinsing the material layer 210 and/or the photoresist layer 220 with water or a liquid solution that includes a solvent and water. In some embodiments, the solvent includes propylene glycol methyl ether acetate, propylene glycol methyl ether, butyl acetate, 1-ethoxy-2-propanol, gamma-butyrolactone, cyclohexanone, ethyl lactate, methanol, ethanol, propanol, n-butanol, acetone, dimethylformamide, acetonitrile, isopropyl alcohol, tetrahydrofuran, acetic acid, or combinations thereof. The amount of water added to the liquid solution is also carefully configured. In some embodiments, the water constitutes from about 0.0001% to about 10% of the liquid solution, for example, from about 0.1% to about 5% of the liquid solution. In some embodiments, the liquid solution may also include one or more additives described above with respect to the photoresist composition. In some embodiments, a water vapor treatment process may be performed, instead of, or in combination with, the rinse process, where the water vapor treatment process applies a water vapor to the material layer 210 and/or the photoresist layer 220. It is understood that the performance of the rinse process and/or the water vapor treatment is optional, and can be omitted in some embodiments.

Figure 2B:
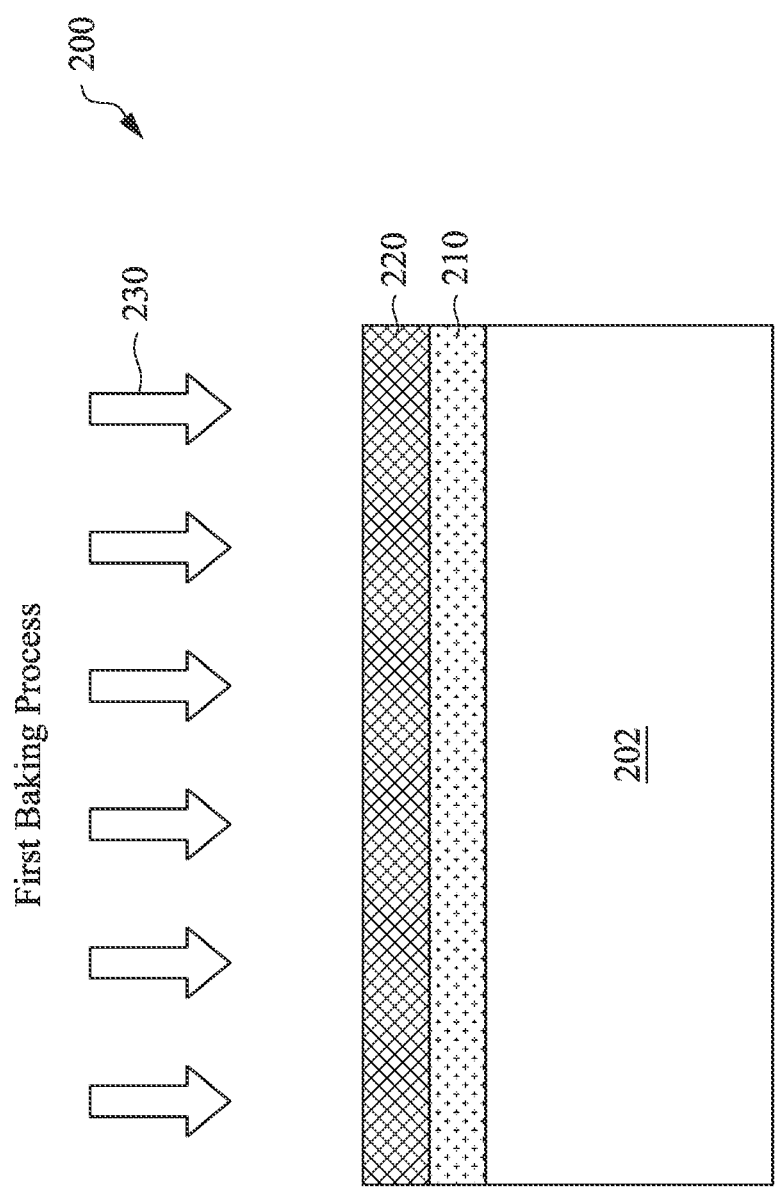

Referring to FIGS. 1 and 2B, the method 100 proceeds to operation 104, in which a first baking process 230 is performed to the semiconductor device 200, in accordance with some embodiments. FIG. 2B is a cross-sectional view of the semiconductor device 200 of FIG. 2A after performing the first baking process 230, in accordance with some embodiments.

Since this first baking process 230 is performed before exposing the photoresist layer 220 to radiation, the first baking process 230 may also be referred to as a pre-exposure-baking process. The purpose of this first baking process 230 includes reducing solvent contents, increasing adhesion, and preventing bubbling. The first baking process 230 may be performed in a chamber with an adjustable humidity setting, for example, in an oven tool of a track system in semiconductor fabrication. In some embodiments, the chamber may include a "hot plate." In some embodiments, the first baking process 230 is performed at a temperature in a range from about 30° C. to about 250° C.

According to various aspects of the present disclosure, a predetermined level of humidity is intentionally introduced as a part of the first baking process 230. In some embodiments, the tool in which the first baking process 230 is performed is configured such that the ambient atmosphere that the photoresist layer 220 is in contact with has a humidity level at least about 55%. For example, in some embodiments, the tool may have a humidity level from about 55% to about 100%, from about 55% to about 90%, from about 55% to about 80%, from about 55% to about 70%, or from about 55% to about 60%. This specifically configured humidity level helps to increase resist sensitivity, which improves both EUV lithography performance and throughput.

In some embodiments, a first cooling process may be performed after the first baking process 230 to cool the semiconductor device 200 to an ambient temperature for a subsequent semiconductor manufacturing process. In some embodiments, the ambient temperature is in a range from about 1° C. to about 32° C. The humidity level of the ambient atmosphere of from about 55% to about 100% is maintained as the semiconductor device 200 is cooled down. The first cooling process may be performed in the same chamber where the first baking process 230 is performed. In some embodiments, the same "hot plate" may be used in the first cooling process. In some embodiments, the chamber may include a "cooling plate" different from the "hot plate."

In some embodiments, after the first baking process 230, the surface of the photoresist layer 220 may be treated with water to increase the water content in the photoresist layer 220. In some embodiments, a rinse process is performed to introduce water to the photoresist layer 220. In some embodiments, the rinse process includes rinsing the photoresist layer 220 with water. In some embodiments, the rinse process includes rinsing the photoresist layer 220 with a liquid solution that includes a solvent and water. In some embodiments, the solvent includes propylene glycol methyl ether acetate, propylene glycol methyl ether, butyl acetate, 1-ethoxy-2-propanol, gamma-butyrolactone, cyclohexanone, ethyl lactate, methanol, ethanol, propanol, n-butanol, acetone, dimethylformamide, acetonitrile, isopropyl alcohol, tetrahydrofuran, acetic acid, or combinations thereof. The amount of water added to the liquid solution is also carefully configured. In some embodiments, the water constitutes from about 0.0001% to about 10% of the liquid solution, for example, from about 0.1% to about 5% of the liquid solution. In some embodiments, the liquid solution may also include one or more additives described above with respect to the photoresist composition. In some embodiments, a water vapor treatment process may be performed, instead of, or in combination with, the rinse process, where the water vapor treatment process applies a water vapor to the photoresist layer 220. It is understood that the performance of the rinse process and/or the water vapor treatment is optional, and can be omitted in some embodiments.

Figure 2C:
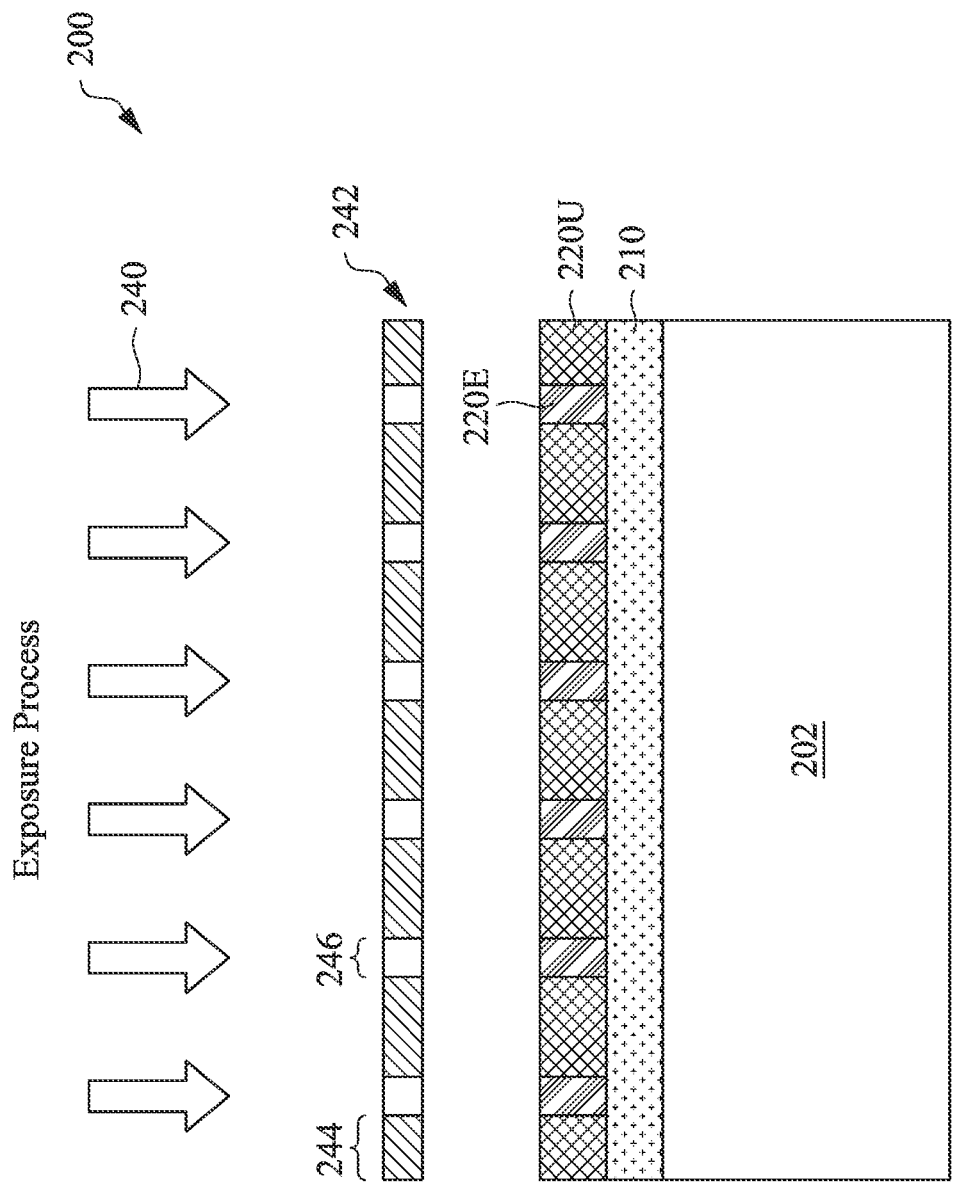

Referring to FIGS. 1 and 2C, the method 100 proceeds to operation 106, in which an exposure process 240 is performed to the semiconductor device 200, in accordance with some embodiments. FIG. 2C is a cross-sectional view of the semiconductor device 200 after performing the exposure process 240, in accordance with some embodiments.

During the exposure process 240, the photoresist layer 220 is exposed to a patterning radiation from a light source through a photomask 242. The photomask 242 has a pre-defined pattern designed for an IC, based on a specification of the IC to be manufactured. The patterns of the photomask 242 correspond to patterns of materials that make up the various components of the IC device to be fabricated. For example, a portion of the IC design layout includes various IC features, such as an active region, gate electrode, source and drain, metal lines or vias of an interlayer interconnection, and openings for bonding pads, to be formed in the substrate 202 and/or the material layer 210 disposed on the substrate 202.

In some embodiments, the photomask 242 includes first regions 244 and second regions 246. In the first regions 244, the patterning radiation is blocked by the photomask 242 to reach the photoresist layer 220, while in the second regions 246, the patterning radiation is not blocked by the photomask 242 and can pass through the photomask 242 to reach the photoresist layer 220. As a result, portions of the photoresist layer 220 below the second regions 246 receive the patterning radiation, referred to as exposed portions 220E, while portions of the photoresist layer 220 below the first regions 244 do not receive the patterning radiation, referred to as unexposed portions 220U.

In some embodiments, the patterning radiation is an EUV radiation (e.g., 13.5 nm). Alternatively, in some embodiments, the patterning radiation is a DUV radiation (e.g., from a 248 nm KrF excimer laser or a 193 nm ArF excimer laser), X-ray radiation, an e-beam radiation, an ion beam radiation, or other suitable radiations. In some embodiments, operation 106 is performed in a liquid (immersion lithography) or in a vacuum for EUV lithography and e-beam lithography.

In some embodiments, the exposed portions 220E of the photoresist layer 220 that are irradiated by the EUV radiation undergo a further condensation reaction to form metallic clusters while the unexposed portions 220U that are not irradiated by the EUV radiation do not undergo the condensation reaction. The exposed portions 220E of the photoresist layer 220 may constitute a latent pattern. As the metallic clusters are substantially insoluble in a developer used in a later development process, the exposed portions 220E of the photoresist layer 220 that are irradiated by the EUV source are substantially insoluble in the developer. The unexposed portions 220U that are not irradiated by the EUV source do not undergo condensation reaction and are soluble in the developer. The difference in solubility allows the latent pattern to be developed in the developing process.

In some embodiments, after the exposure process 240, the surface of the photoresist layer 220 may be treated with water to increase the water content in the photoresist layer 210. In some embodiments, a rinse process is performed to introduce water to the photoresist layer 220. In some embodiments, the rinse process includes rinsing the photoresist layer 220 with water. In some embodiments, the rinse process includes rinsing the photoresist layer 220 with a liquid solution that includes a solvent and water. In some embodiments, the solvent includes propylene glycol methyl ether acetate, propylene glycol methyl ether, butyl acetate, 1-ethoxy-2-propanol, gamma-butyrolactone, cyclohexanone, ethyl lactate, methanol, ethanol, propanol, n-butanol, acetone, dimethylformamide, acetonitrile, isopropyl alcohol, tetrahydrofuran, acetic acid, or combinations thereof. The amount of water added to the liquid solution is also carefully configured. In some embodiments, the water constitutes from about 0.0001% to about 10% of the liquid solution, for example, from about 0.1% to about 5% of the liquid solution. In some embodiments, the liquid solution may also include one or more additives described above with respect to the photoresist composition. In some embodiments, a water vapor treatment process may be performed, instead of, or in combination with, the rinse process, where the water vapor treatment process applies a water vapor to the photoresist layer 220. It is understood that the performance of the rinse process and/or the water vapor treatment is optional, and can be omitted in some embodiments.

Figure 2D:
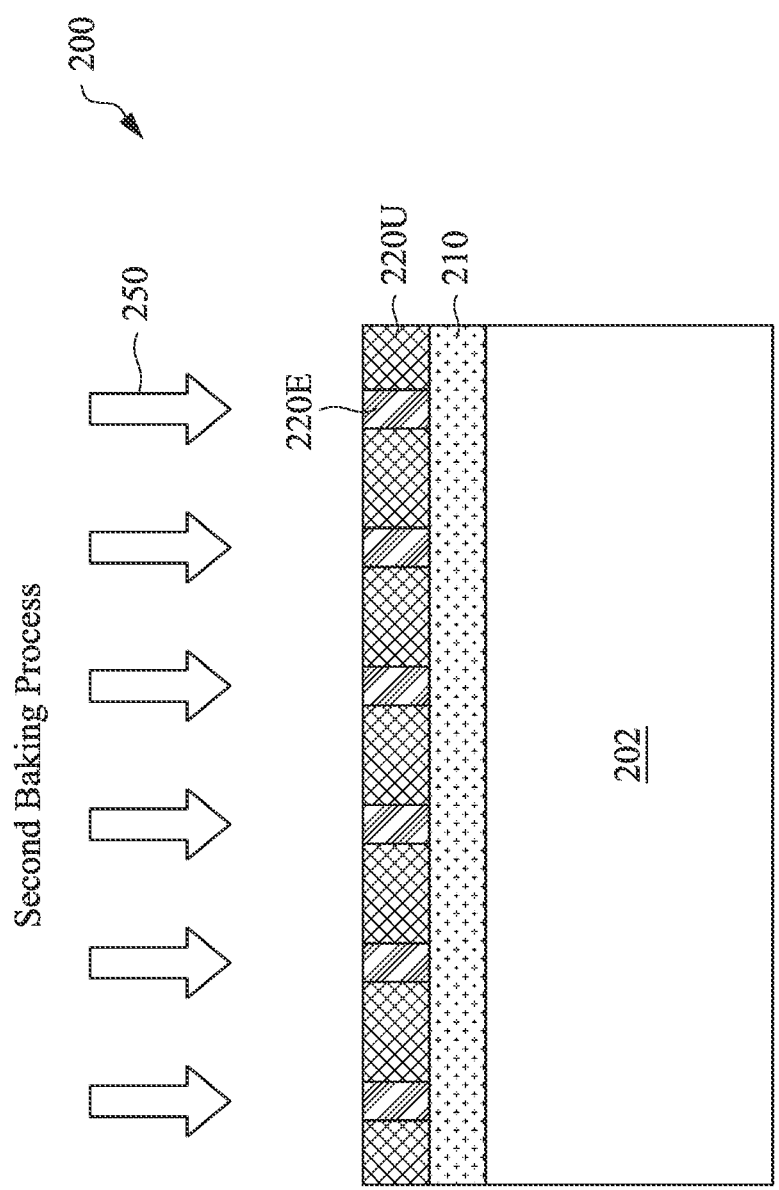

Referring to FIGS. 1 and 2D, the method 100 proceeds to operation 108, in which a second baking process 250 is performed, in accordance with some embodiments. FIG. 2D is a cross-sectional view of the semiconductor device 200 after performing the second baking process 250, in accordance with some embodiments.

Since this second baking process 250 is performed after the exposure process 240 that exposes the photoresist layer 220 to radiation, the second baking process 250 may also be referred to as a post-exposure-baking (PEB) process. The second baking process 250 may also be performed in a chamber (e.g., a hot plate) with an adjustable humidity setting, for example, in an oven tool of a track system in semiconductor fabrication.

In some embodiments, the second baking process 250 and the first baking process 230 are performed in the same hot plate or using the same tool. Also similar to the first baking process 230, the second baking process 250 intentionally introduces a predetermined level of humidity to the photoresist layer 220. For example, the hot plate (or any other suitable tool in which the second baking process 250 is performed) is specifically configured to achieve a humidity level from about 55% 100% for the ambient atmosphere exposed to the photoresist layer 220. For example, in some embodiments, the tool may have a humidity level from about 55% to about 100%, from about 55% to about 90%, from about 55% to about 80%, from about 55% to about 70%, or from about 55% to about 60%. As is the case for the first baking process 230, this specifically configured humidity level associated with the second baking process 250 also allows the photoresist layer 220 to have increased resist sensitivity, which helps improve both EUV lithography performance and throughput. It is understood that the particular humidity levels for the second baking process 250 and for the first baking process 230 may be configured to be the same in some embodiments, or differently in other embodiments.

In some embodiments, the second baking process 250 is performed at a temperature in a range from about 30° C. to about 250° C. It is understood that the particular temperatures for the second baking process 250 and for the first baking process 230 may be configured to be the same in some embodiments, or differently in other embodiments.

In some embodiments, a second cooling process may be performed after the second baking process 250 to cool the semiconductor device 200 to an ambient temperature for a subsequent semiconductor manufacturing process. In some embodiments, the ambient temperature is in a range from about 1° C. to about 32° C. The humidity level of the ambient atmosphere of from about 55% to about 100% is maintained as the semiconductor device 200 is cooled down after the second baking process 250. In some embodiments, the second cooling process and the first cooling process are performed in the same cooling plate or using the same tool.

In some embodiments, after the second baking process 250, the surface of the photoresist layer 220 may be treated with water to increase the water content in the photoresist layer 220. In some embodiments, a rinse process is performed to introduce water to the photoresist layer 220. In some embodiments, the rinse process includes rinsing the photoresist layer 220 with water. In some embodiments, the rinse process includes rinsing the photoresist layer 220 with a liquid solution that includes a solvent and water. In some embodiments, the solvent includes propylene glycol methyl ether acetate, propylene glycol methyl ether, butyl acetate, 1-ethoxy-2-propanol, gamma-butyrolactone, cyclohexanone, ethyl lactate, methanol, ethanol, propanol, n-butanol, acetone, dimethylformamide, acetonitrile, isopropyl alcohol, tetrahydrofuran, acetic acid, or combinations thereof. The amount of water added to the liquid solution is also carefully configured. In some embodiments, the water constitutes from about 0.0001% to about 10% of the liquid solution, for example, from about 0.1% to about 5% of the liquid solution. In some embodiments, the liquid solution may also include one or more additives described above with respect to the photoresist composition. In some embodiments, a water vapor treatment process may be performed, instead of, or in combination with, the rinse process, where the water vapor treatment process applies a water vapor to the photoresist layer 220. It is understood that the performance of the rinse process and/or the water vapor treatment is optional, and can be omitted in some embodiments.

Figure 2E:
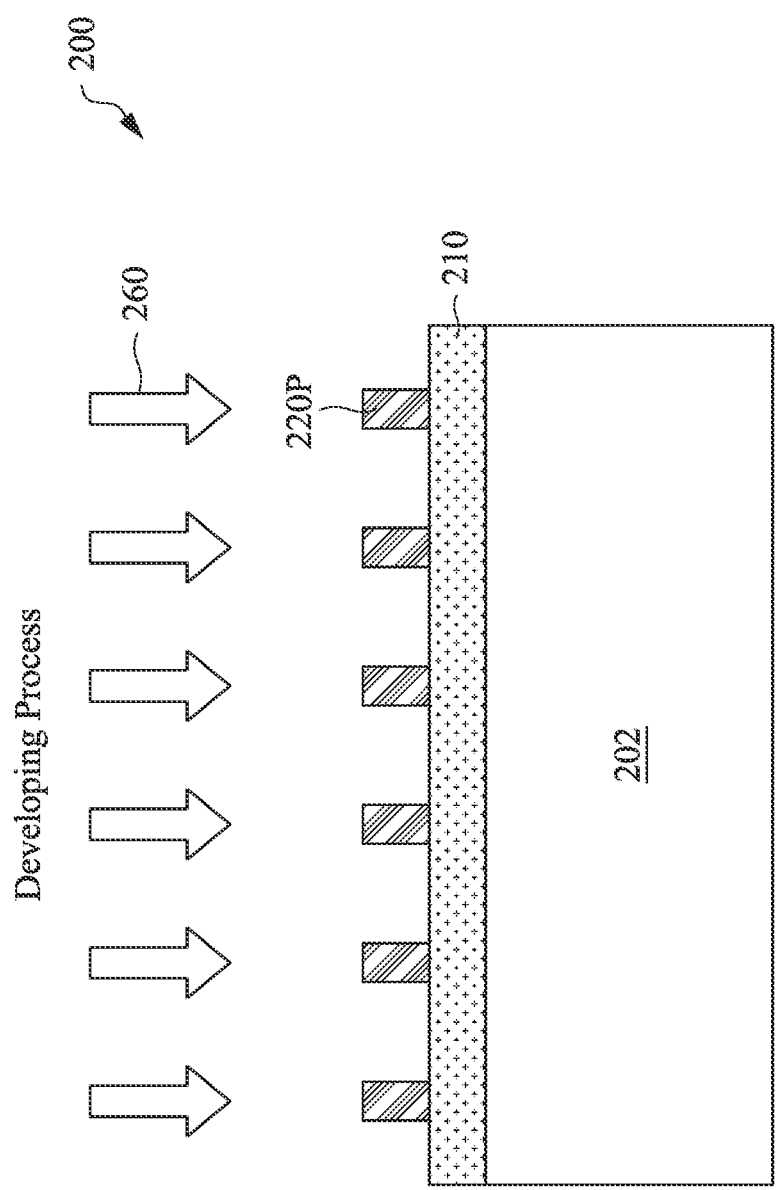

Referring to FIGS. 1 and 2E, the method 100 proceeds to operation 110, in which a developing process 260 is performed to the photoresist layer 220, in accordance with some embodiments. FIG. 2E is a cross-sectional view of the semiconductor device 200 of FIG. 2D after performing the developing process 260, in accordance with some embodiments.

The developing process 260 includes applying a developer to the photoresist layer 220. The developer may remove the exposed or unexposed portions of the photoresist layer 220 depending on the resist type. For example, and as shown in FIG. 2E, the photoresist layer 220 includes a negative tone resist, so the exposed portions 240E of the photoresist layer 220 are not dissolved by the developer and remain in the semiconductor device 200. On the other hand, if the photoresist layer 220 includes a positive tone resist, the portions of the photoresist layer 220 that are exposed by the patterning radiation would be dissolved by the developer, leaving the unexposed portions in the semiconductor device 200. After the developing process, a patterned photoresist layer 220P is formed. In the embodiment of the present disclosure, the patterned photoresist layer 220P includes the exposed portions 220E of the photoresist layer 220.

In some embodiments, the developing process 260 is a wet developing process in which a developer solution comprising a solvent developer and water is used. In some embodiments, the solvent developer includes methanol, ethanol, 1-butanol, 4-methyl-2-pentanol, 2-heptanone, n-butyl acetate.

Water is added to the developer solution herein to introduce humidity to the photoresist layer 220, and the amount of water added to the developer solution is also carefully configured. In some embodiments, the water constitutes between about 0.00001% to about 50% of the developer solution. In some embodiments, the developer solution contains about 0.1%, about 1%, about 5%, about 10%, about 15%, about 20%, about 25%, about 30%, about 35%, about 40%, or about 45% of water by weight.

The developer solution may be applied using any suitable methods. In some embodiments, the developer solution is applied by dipping the semiconductor device 200 into a developer bath. In some embodiments, the developer solution is sprayed onto the photoresist layer 220.

In some embodiments, the developing process 260 is a dry developing process in which a developer gas containing an etching gas and water vapor is used. Water is added to the developer gas herein to introduce humidity to the photoresist layer 220, and the amount of water added to the developer gas is also carefully configured. In some embodiments, the water constitutes between about 0.00001% to about 50% of the developer gas. In some embodiments, the developer gas contains about 0.1%, about 1%, about 5%, about 10%, about 15%, about 20%, about 25%, about 30%, about 35%, about 40%, or about 45% of water by weight.

In some embodiments, at each operation, i.e., operation 102, 104, 106, 108, and 110, a purge gas that contains $N_2$, $CO_2$, and dry air may be introduced in order to improve reaction control. The purge air, $N_2/CO_2$/dry air, may be controlled to have a humidity level in a range from about 0% to about 100%, so as to optimize sensitivity control.

Referring to FIGS. 1 and 2F, the method 100 proceeds to operation 112, in which the material layer 210 is etched using the patterned photoresist layer 220P as an etch mask, in accordance with some embodiments. FIG. 2F is a cross-sectional view of the semiconductor device 200 after etching the material layer 210 using the patterned photoresist layer 220P as an etch mask, in accordance with some embodiments.

As shown in FIG. 2F, the material layer 210 is patterned, using the patterned photoresist layer 220P as an etch mask, to form a patterned material layer 210P.

An etching process may be performed to transfer the pattern in the patterned photoresist layer 220P to the material layer 210. In some embodiments, the etching process employed is an anisotropic etch such as a dry etch although any suitable etch process may be utilized. In some embodiments, the dry etch is a reactive ion etch (ME) or a plasma etch. In some embodiments, the dry etch is implemented by fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. In some embodiments, an oxygen plasma is performed to etch the material layer 210. In some embodiments, the anisotropic etch is performed at a temperature from about 250° C. to 450° C. for a duration from about 20 seconds to about 300 seconds.

If not completely consumed in the etching process, after formation of the patterned material layer 210P, the patterned photoresist layer 220P is removed, for example, by plasma ashing or wet stripping.

In the present disclosure, by increasing the water content in the photoresist layer 220 to facilitate hydrolysis of the metallic-type photoresist by one or more of the processes described above, the resist sensitivity can be improved by about 2% to about 40%. The process window can be enlarged by about 2% to about 40%. As a result, the EUV lithography performance can be improved. Meanwhile, wafer throughput can also be improved. Additionally, the processes discussed above are compatible with existing fabrication process flow and are easy to implement.

Figure 5:
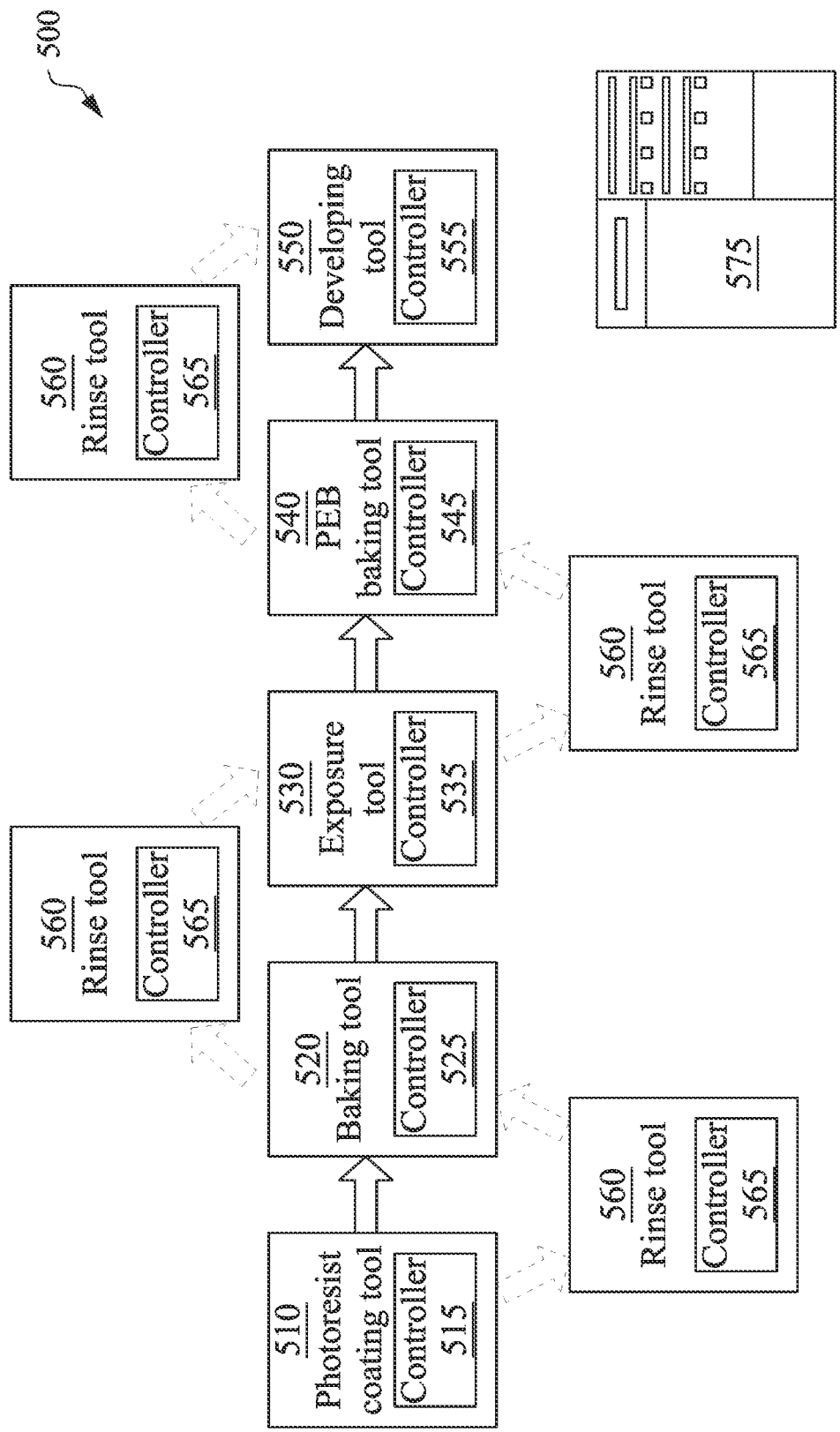
FIG. 5 is a diagrammatic view of a system for fabrication of a semiconductor device, in accordance with some embodiments.

FIG. 5 is a simplified diagrammatic view of a portion of a semiconductor fabrication system 500 that may be used to perform the various fabrication processes discussed above with reference to FIGS. 2A-2F, in accordance with some embodiments.

The semiconductor fabrication system 500 includes a photoresist coating tool 510. The photoresist coating tool 510 may be used to coat the photoresist layer 220 over the material layer 210 as a part of the spin coating process discussed above with reference to FIG. 2A. In some embodiments, the photoresist coating tool 510 includes a bottle or container for mixing the photoresist chemicals (e.g., organometallic compounds), the solvent, the water, and the additives. The photoresist coating tool 510 may also include nozzles for spraying liquids, such as the photoresist compound that is made up of the photoresist chemicals, the solvent, the water, and the additives. The photoresist coating tool 510 may also include a stage for holding and/or spinning a substrate 202 while the photoresist layer 220 is coated thereon. The photoresist coating tool 510 may further include a controller 515 for configuring the various process parameters of the spin coating process, for example, the amount of water to add to the photoresist composition (e.g., to achieve a water content from about 0.0001% and about 5% of the solvent in photoresist composition).

The semiconductor fabrication system 500 includes a baking tool 520. The baking tool 520 may be used to bake the photoresist layer 220 as a part of the first baking process 230 discussed above with reference to FIG. 2B. In some embodiments, the baking tool 520 includes a "hot plate" as a part of a track semiconductor fabrication system. In some embodiments, the baking tool 520 may further include a "cooling plate." The hot and cooling plates may have an adjustable setting for humidity control. The baking tool 520 may also include a controller 525 for configuring the various process parameters of the first baking process 230, for example, the humidity setting of the hot/cold plates and the baking and cooling temperatures.

The semiconductor fabrication system 500 includes an exposure tool 530. The exposure tool 530 may be used to expose the photoresist layer 220 as a part of the exposure process 240 discussed above with reference to FIG. 2C. In some embodiments, the exposure tool 530 includes an EUV scanner for exposing the photoresist layer 220 to an EUV radiation. The exposure tool 530 may also include a controller 535 for configuring the various process parameters of the exposure process 240.

The semiconductor fabrication system 500 includes a post-exposure baking (PEB) tool 540. The PEB tool 540 may be used to bake the photoresist layer 220 as a part of the second baking process 250 discussed above with reference to FIG. 2D. In some embodiments, the PEB tool 540 includes a "hot plate" as a part of a track semiconductor fabrication system. In some embodiments, the baking tool 520 may further include a "cooling plate." The hot and cooling plates may have an adjustable setting for humidity control. The PEB tool 540 may also include a controller 545 for configuring the various process parameters of the second baking process 250, for example, the humidity setting and temperature of the hot plate/cold plate.

The semiconductor fabrication system 500 includes a developing tool 550. The developing tool 550 may be used to develop the photoresist layer 220 as a part of the developing process 260 discussed above with reference to FIG. 2E. In some embodiments, the developing tool 550 includes nozzles or other dispensing units that are configured to dispense the developer solution with water mixed therein. The developing tool 550 may also include a controller 555 for configuring the various process parameters of the developing process 260, for example, the amount of water to add to the developer solution.

The semiconductor fabrication system 500 includes a rinse tool 560. The rinse tool 560 may be used to rinse the photoresist layer 220 at different steps discussed above. In some embodiments, the rinse tool 560 includes nozzles or other dispensing units that are configured to dispense water or the solvent with water mixed therein. The rinse tool 560 may also include a controller 565 for configuring the various process parameters of the rinse process, for example, the amount of water to add to the solvent.

It is understood that the arrows shown in FIG. 5 indicate the sequential order in which the semiconductor fabrication processes are performed using the semiconductor fabrication system 500. The dashed arrows before and after the rinse tool 560 indicate that the rinse processes using the rinse tool 560 are optionally performed.

Although the tools 510-560 of the semiconductor fabrication system 500 are illustrated as separate tools in FIG. 5, it is understood that one or more of these tools may be integrated into the same tool. For example, the PEB tool 540 and the baking tool 520 may be implemented as the same tool. In addition, some of the tools 510-560 discussed above may share certain components, such as the nozzles or dispensing units for dispensing liquids, or even the controllers 515-565. In addition, the semiconductor fabrication system 500 may also include a central controller 575 in some embodiments, where the central controller 575 may be used to replace one or more of the functionalities of any of the controllers 515-565.

One aspect of this description relates to a method for forming a semiconductor device. The method includes applying a photoresist composition over a substrate, thereby forming a photoresist layer over the substrate; performing a first baking process to the photoresist layer; exposing the photoresist layer to an extreme ultraviolet (EUV) radiation, thereby forming a pattern therein; performing a second baking process to the photoresist layer; and developing the photoresist layer having the pattern therein using a developer, thereby forming a patterned photoresist layer. The first baking process and the second baking process are conducted under an ambient atmosphere having a humidity level ranging from 55% to 100%.

Another aspect of this description relates to a method for forming a semiconductor structure. The method includes depositing a photoresist layer on a material layer disposed on a substrate by applying a photoresist composition to the material layer, the photoresist composition comprising an organometallic compound, a solvent and water, wherein the photoresist composition comprises from 0.0001% to 5% by weight of water with respect to the solvent; performing a first baking process to the photoresist layer; performing a first cooling process to the photoresist layer; exposing the photoresist layer to an extreme ultraviolet (EUV) radiation, thereby forming a pattern therein; performing a second baking process to the photoresist layer comprising the pattern; performing a second cooling process to the photoresist layer; developing the photoresist layer having the pattern therein using a developer, thereby forming a patterned photoresist layer; and etching the material layer using the patterned photoresist layer as an etch mask. The first baking process, the first cooling process, the second baking process and the second cooling process are conducted under an ambient atmosphere having a humidity level ranging from 55% to 100%.

Still another aspect of this description relates to a method for forming a semiconductor structure. The method includes (a) depositing a material layer on a substrate; (b) depositing a photoresist layer on the material layer; (c) performing a first baking process to the photoresist layer; (d) performing a first cooling process to the photoresist layer; (e) exposing the photoresist layer to an extreme ultraviolet (EUV) radiation, thereby forming a pattern therein; (f) performing a second baking process to the photoresist layer comprising the pattern; (g) performing a second cooling process to the photoresist layer; and (h) developing the photoresist layer having the pattern therein using a developer, thereby forming a patterned photoresist layer. Water is introduced into each of steps (a)-(h).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
    forming a material layer over a substrate;
    treating a surface of the material layer with water;
    applying a photoresist composition over the surface of the material layer, thereby forming a photoresist layer over the material layer;
    performing a first baking process to the photoresist layer;
    exposing the photoresist layer to an extreme ultraviolet (EUV) radiation, thereby forming a pattern therein;
    performing a second baking process to the photoresist layer;
    developing the photoresist layer having the pattern therein using a developer, thereby forming a patterned photoresist layer; and
    etching the material layer to remove portions of the material layer not covered by the patterned photoresist layer,
    wherein the first baking process and the second baking process are conducted under an ambient atmosphere having a humidity level ranging from 55% to 100%.

2. The method of claim 1, wherein the photoresist composition comprises an organometallic compound and a solvent.

3. The method of claim 2, wherein the photoresist composition further comprises from 0.001% to 5% by weight of water relative to the solvent.

4. The method of claim 2, wherein the solvent comprises 2-methoxyethyl ether, ethylene glycol monomethyl ether or propylene glycol monomethyl ether.

5. The method of claim 3, wherein the photoresist composition further comprises one or more additives selected from an acid, a base, an alcohol, or combinations thereof.

6. The method of claim 5, wherein the photoresist composition comprises from 0.00001% to 99% of the one or more additives relative to water.

7. The method of claim 1, wherein the developer is water or a developer solution comprising a solvent and water, wherein the developer solution comprises from 0.00001% to 50% by weight of water.

8. The method of claim 1, wherein the developer is a developer gas comprising water, wherein the developer gas comprises from 0.00001% to 50% by weight of water.

9. A method of forming a semiconductor device, comprising:
    depositing a photoresist layer on a material layer disposed on a substrate by applying a photoresist composition to the material layer, the photoresist composition comprising an organometallic compound, a solvent and water, wherein the photoresist composition comprises from 0.0001% to 5% by weight of water with respect to the solvent;
    performing a first baking process to the photoresist layer;
    performing a first cooling process to the photoresist layer;
    exposing the photoresist layer to an extreme ultraviolet (EUV) radiation, thereby forming a pattern therein;
    performing a second baking process to the photoresist layer comprising the pattern;
    performing a second cooling process to the photoresist layer;
    developing the photoresist layer having the pattern therein using a developer, thereby forming a patterned photoresist layer; and
    etching the material layer using the patterned photoresist layer as an etch mask,
    wherein the first baking process, the first cooling process, the second baking process and the second cooling process are conducted under an ambient atmosphere having a humidity level ranging from 55% to 100%.

10. The method of claim 9, further comprising introducing water to the material layer prior to depositing the photoresist layer.

11. The method of claim 10, where introducing water to the material layer comprises rinsing a surface of the material layer with water or a liquid solution comprising a solvent and water.

12. The method of claim 10, wherein introducing water to the material layer comprises treating a surface of the material layer with a water vapor.

13. The method of claim 9, further comprising introducing water to the photoresist layer prior to or after each of the first baking process, the first cooling process, the second baking process and the second cooling process.

14. The method of claim 13, where introducing water to the photoresist layer comprises rinsing a surface of the photoresist layer with water or a liquid solution comprising a solvent and water.

15. The method of claim 13, wherein introducing water to the photoresist layer comprises treating a surface of the photoresist layer with a water vapor.

16. A method of forming a semiconductor device, comprising:
(a) depositing a material layer on a substrate;
(b) depositing a photoresist layer on the material layer;
(c) performing a first baking process to the photoresist layer;
(d) performing a first cooling process to the photoresist layer;
(e) exposing the photoresist layer to an extreme ultraviolet (EUV) radiation, thereby forming a pattern therein;
(f) performing a second baking process to the photoresist layer comprising the pattern;
(g) performing a second cooling process to the photoresist layer; and
(h) developing the photoresist layer having the pattern therein using a developer, thereby forming a patterned photoresist layer,
wherein water is introduced into each of steps (a)-(h).

17. The method of claim 16, further comprising introducing a purging gas in at least one step of steps (a)-(h), wherein the purging gas has a humidity level from 0% to 100%.

18. The method of claim 17, wherein the purging gas comprises a mixture of $N_2$, $CO_2$ and air.

19. The method of claim 16, wherein water is introduced at the first baking process, the first cooling process, the second baking process and the second cooling process by conducting the first baking process, the first cooling process, the second baking process and the second cooling process under an ambient atmosphere having a humidity level ranging from 55% to 100%.

20. The method of claim 16, wherein water is introduced at depositing the photoresist layer by introducing water into a photoresist composition from which the photoresist layer is formed.

* * * * *